US012805033B2

(12) United States Patent
Yahata

(10) Patent No.: US 12,805,033 B2
(45) Date of Patent: Nov. 17, 2026

(54) IMAGE SENSING DEVICE AND IMAGING DEVICE INCLUDING THE SAME

(71) Applicant: SK hynix Inc., Icheon-si (KR)

(72) Inventor: Kazuhiro Yahata, Tokyo (JP)

(73) Assignee: SK HYNIX INC., Icheon-si (KR)

( * ) Notice: Subject to any disclaimer, the term of this patent is extended or adjusted under 35 U.S.C. 154(b) by 307 days.

(21) Appl. No.: 18/496,674

(22) Filed: Oct. 27, 2023

(65) Prior Publication Data

US 2024/0145518 A1 May 2, 2024

(30) Foreign Application Priority Data

Oct. 28, 2022 (KR) ........................ 10-2022-0140908

(51) Int. Cl.
*H10F 39/18* (2025.01)
*H04N 23/84* (2023.01)
*H10F 39/00* (2025.01)

(52) U.S. Cl.
CPC ......... *H10F 39/182* (2025.01); *H04N 23/843* (2023.01); *H10F 39/8027* (2025.01)

(58) Field of Classification Search
CPC ..................................................... H10F 39/182
See application file for complete search history.

(56) References Cited

U.S. PATENT DOCUMENTS 10,368,041 B2 7/2019 Iwakura et al.
2025/0107258 A1 * 3/2025 Sakamoto .............. H04N 25/70

FOREIGN PATENT DOCUMENTS

JP 2009017152 A 1/2009
JP 4957413 B2 3/2012
KR 20160072508 A 6/2016
KR 20190084780 A 7/2019

OTHER PUBLICATIONS

Request for the Submission of an Opinion for KR Appl. No. 10-2022-0140908, mailed on Jul. 29, 2026, 14 pages with English translation.

* cited by examiner

*Primary Examiner* — Yu-Hsi D Sun
(74) *Attorney, Agent, or Firm* — Ashurst Perkins Coie US LLP

(57) ABSTRACT

An image sensing device is provided to comprise first to fourth pixel groups arranged in a (2×2) matrix including two rows and two columns, wherein each of the first to fourth pixel groups includes 1) at least one of a red pixel including a red color filter configured to transmit light corresponding to a red color, a green pixel including a green color filter configured to transmit light corresponding to a green color, or a blue pixel including a blue color filter configured to transmit light corresponding to a blue color, and 2) at least one cyan pixel including a cyan color filter configured to transmit light corresponding to the green color and the blue color.

16 Claims, 12 Drawing Sheets

IMAGE SENSING DEVICE AND IMAGING DEVICE INCLUDING THE SAME

CROSS-REFERENCE TO RELATED APPLICATION

This patent document claims the priority and benefits of Korean patent application No. 10-2022-0140908, filed on Oct. 28, 2022, the disclosure of which is incorporated herein by reference in its entirety as part of the disclosure of this patent document.

TECHNICAL FIELD

The technology and implementations disclosed in this patent document generally relate to an image sensing device capable of generating image data by sensing light, and an imaging device including the same.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an imaging device capable of securing good contrast in a miniaturized pixel.

In one aspect, an image sensing device is provided to include first to fourth pixel groups arranged in a (2×2) matrix, wherein each of the first to fourth pixel groups includes at least one of a red pixel, a green pixel, and a blue pixel, and at least one cyan pixel.

In another aspect, an image sensing device is provided to comprise first to fourth pixel groups arranged in a (2×2) matrix including two rows and two columns, wherein each of the first to fourth pixel groups includes 1) at least one of a red pixel including a red color filter configured to transmit light corresponding to a red color, a green pixel including a green color filter configured to transmit light corresponding to a green color, or a blue pixel including a blue color filter configured to transmit light corresponding to a blue color, and 2) at least one cyan pixel including a cyan color filter configured to transmit light corresponding to the green color and the blue color.

In another aspect, an imaging device is provided to include: an image sensing device configured to have a pixel array that includes red pixels, green pixels, blue pixels, and cyan pixels; and an image signal processor (ISP) configured to generate RGB image data by interpolating raw image data, which is a set of image data generated from the red pixels, image data generated from the green pixels, image data generated from the blue pixels, and image data generated from the cyan pixels, wherein the pixel array includes a plurality of pixel groups, each of which includes at least one of the red pixel, the green pixel, the blue pixel, and at least one cyan pixel.

In another aspect, an imaging device is provided to comprise: an image sensing device configured to have a pixel array that includes red pixels configured to generate first image data in response to receiving light corresponding to a red color, green pixels configured to generate second image data in response to receiving light corresponding to a green color, blue pixels configured to generate third image data in response to receiving light corresponding to a blue color, and cyan pixels configured to generate fourth image data in response to receiving light corresponding to the blue color and the green color; and an image signal processor (ISP) configured to generate RGB image data by interpolating raw image data including the first image data, the second image data, the third image data, and the fourth image data, wherein the pixel array includes a plurality of pixel groups, each of which includes 1) at least one of the red pixel, the green pixel, or the blue pixel, and 2) at least one cyan pixel.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
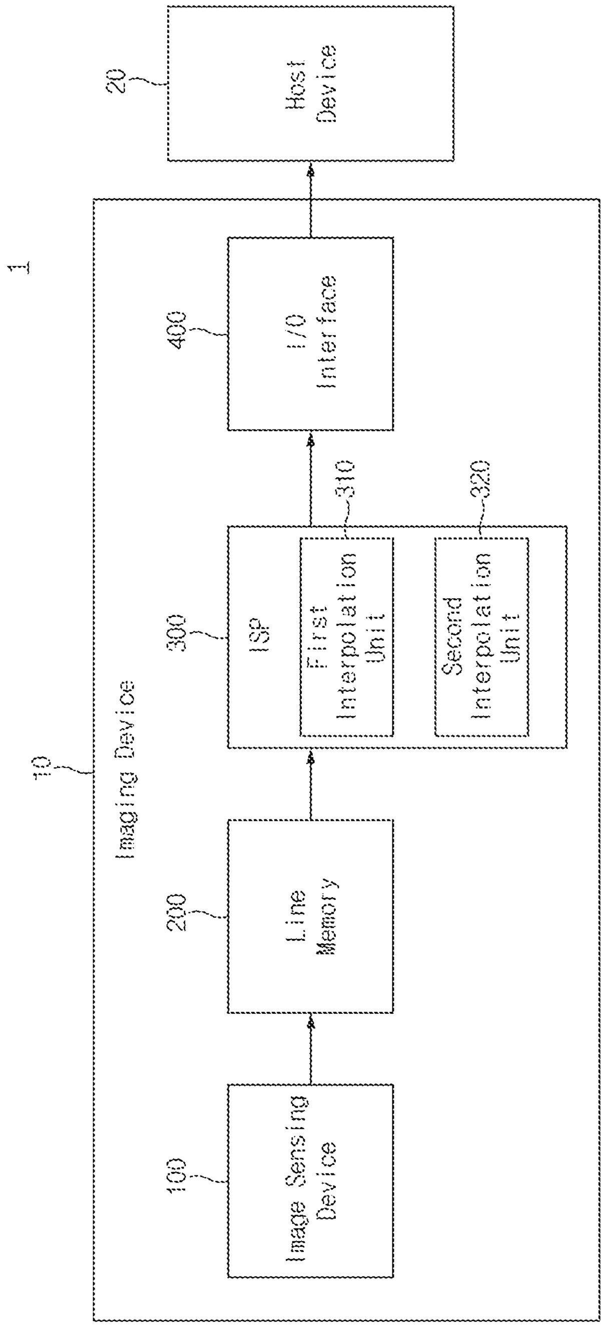
FIG. 1 is a block diagram illustrating an example of an imaging device based on some implementations of the disclosed technology.

This patent document provides implementations and examples of an image sensing device capable of generating image data by sensing light and an imaging device including the same that may be used in configurations to substantially address one or more technical or engineering issues and to mitigate limitations or disadvantages encountered in some other image sensing devices. Some implementations of the disclosed technology relate to an imaging device capable of securing good contrast in a miniaturized pixel. The disclosed technology provides various implementations of an image sensing device which can obtain an image having improved contrast (higher-contrast image) by arranging a portion of cyan pixels in a pixel array.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 2:
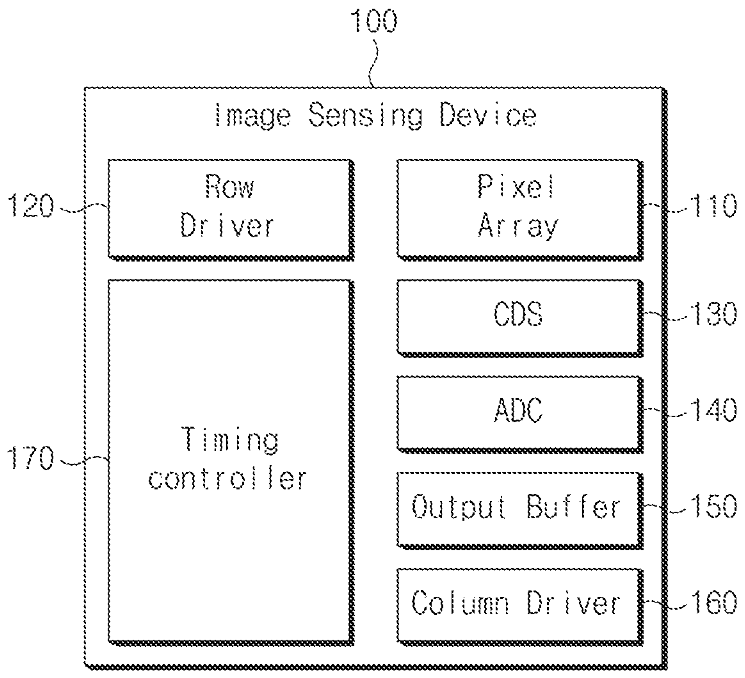
FIG. 2 is a block diagram illustrating an example of an image sensing device shown in FIG. 1 based on some implementations of the disclosed technology.
Figure 3:
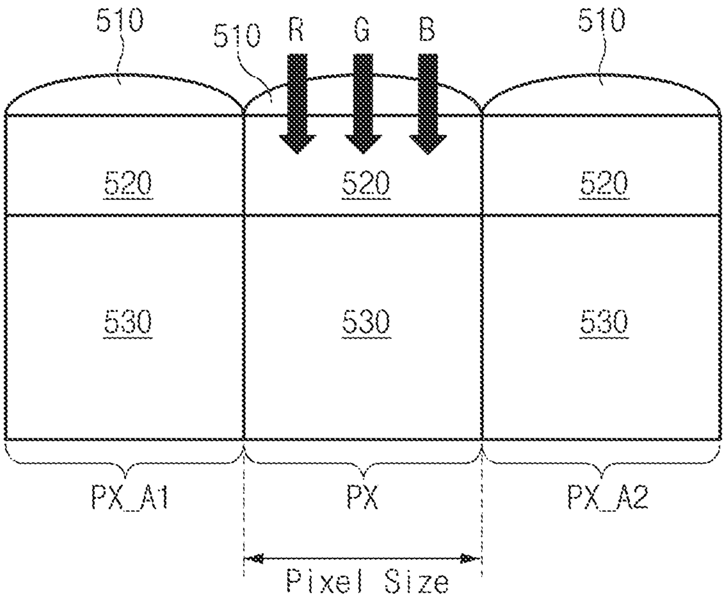
FIG. 3 is a schematic diagram illustrating an example of pixels adjacent to each other based on some implementations of the disclosed technology.
Figure 4A:
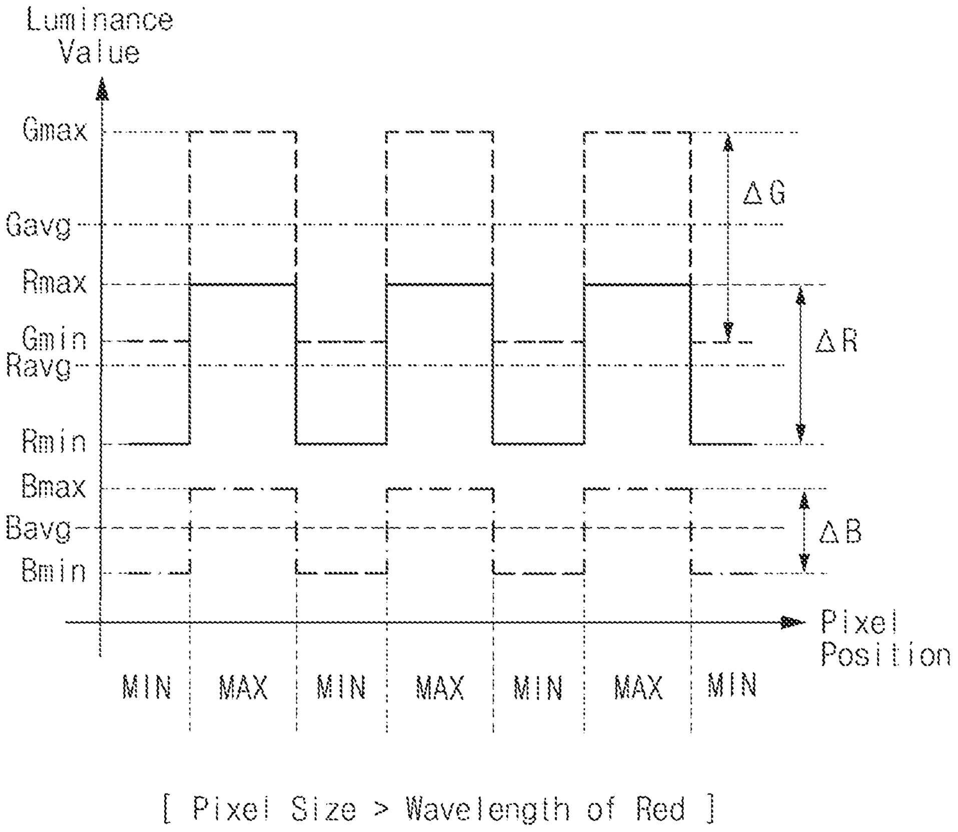
FIGS. 4A and 4B are graphs illustrating luminance ranges for each color that vary depending on pixel sizes based on some implementations of the disclosed technology.
Figure 4B:
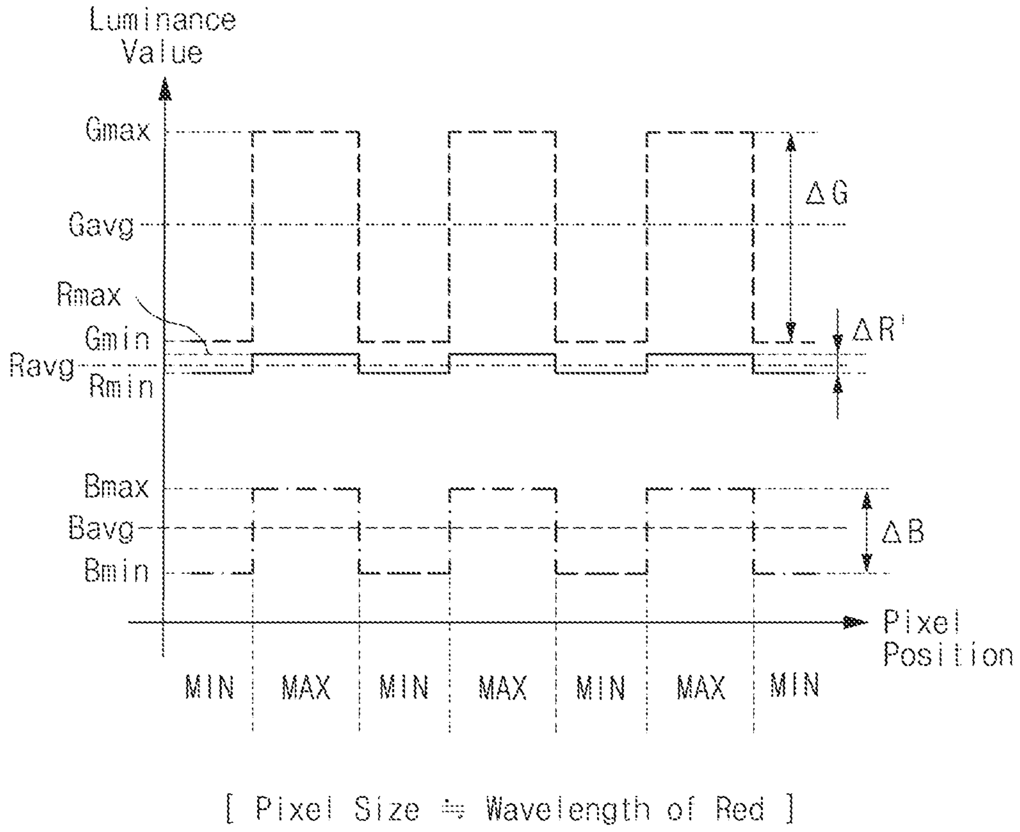
Figure 5A:
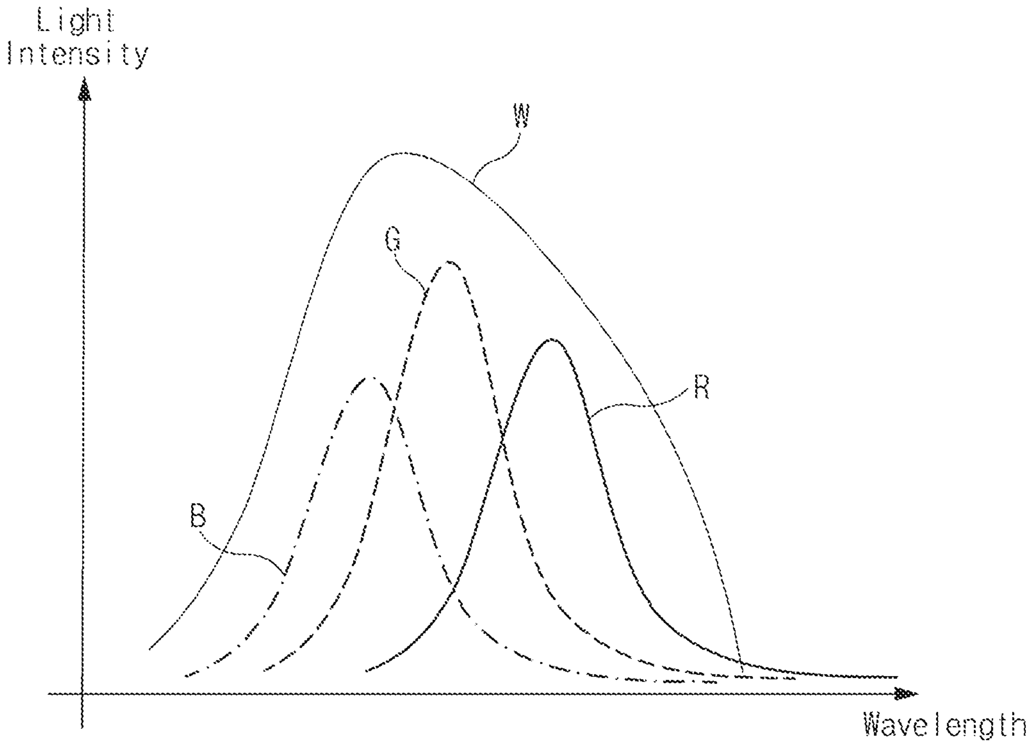
FIG. 5A is a graph illustrating the result of illuminance comparison among white light, red light, green light, and blue light according to wavelengths thereof based on some implementations of the disclosed technology.
Figure 5B:
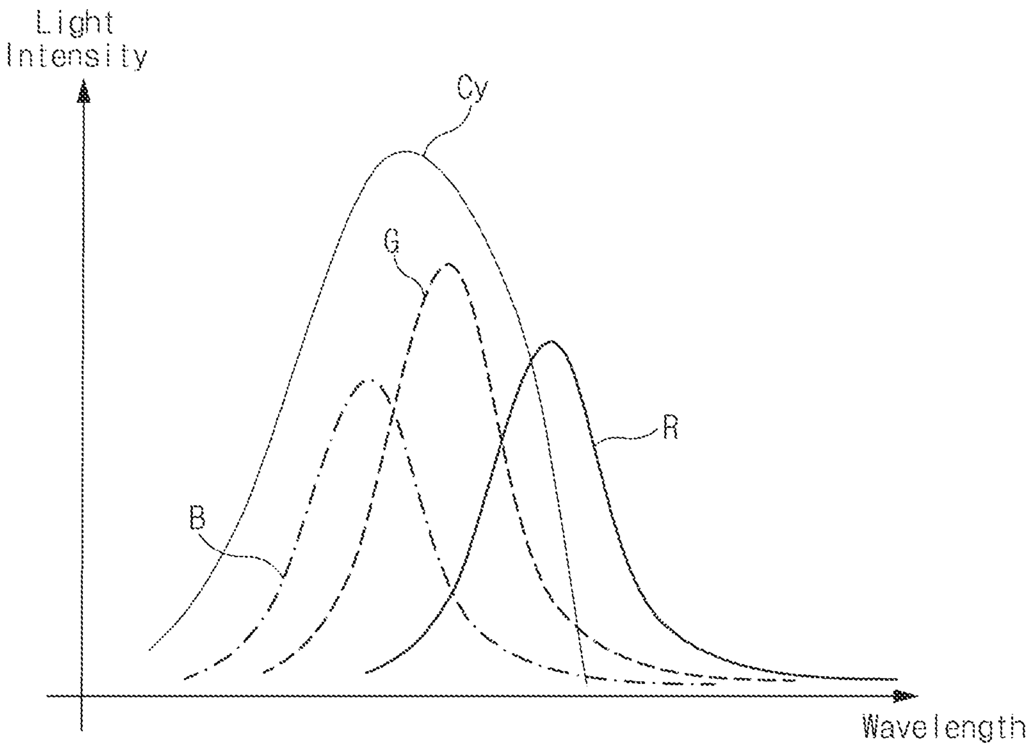
FIG. 5B is a graph illustrating the result of illuminance comparison among cyan light, red light, green light, and blue light according to wavelengths thereof based on some implementations of the disclosed technology.

FIG. 1 is a block diagram illustrating an example of an imaging system 1 based on some implementations of the disclosed technology. FIG. 2 is a block diagram illustrating an example of an image sensing device 100 shown in FIG. 1. FIG. 3 is a schematic diagram illustrating an example of pixels adjacent to each other. FIGS. 4A and 4B are graphs illustrating luminance ranges for each color that vary depending on pixel sizes based on some implementations of the disclosed technology. FIG. 5A is a graph illustrating the result of illuminance comparison among white light, red light, green light, and blue light according to wavelengths thereof. FIG. 5B is a graph illustrating the result of illuminance comparison among cyan light, red light, green light, and blue light according to wavelengths thereof.

Referring to FIG. 1, the imaging system 1 may refer to a device, for example, a digital still camera for photographing still images or a digital video camera for photographing moving images. For example, the imaging device 10 may be implemented as a Digital Single Lens Reflex (DSLR) camera, a mirrorless camera, or a smartphone, and others. The imaging device 10 may include a device having both a lens and an image pickup element such that the device can capture (or photograph) a target object and can thus create an image of the target object.

The imaging system 1 may include an imaging device 10 and a host device 20.

The imaging device 10 may include an image sensing device 100, a line memory 200, an image signal processor (ISP) 300, and an input/output (I/O) interface 400.

The image sensing device 100 may be or include a complementary metal oxide semiconductor image sensor (CIS) for converting an optical signal into an electrical signal. The image sensing device 100 may control overall operations such as on/off, operation mode, operation timing, sensitivity, etc. by the ISP 300. The image sensing device 100 may provide the line memory 200 with image data obtained by converting the optical signal into the electrical signal under control of the ISP 300.

Referring to FIG. 2, the image sensing device 100 may include a pixel array 110, a row driver 120, a correlated double sampler (CDS) 130, an analog-digital converter (ADC) 140, an output buffer 150, a column driver 160, and a timing controller 170. The components of the image sensing device 100 illustrated in FIG. 2 are discussed by way of example only, and this patent document encompasses numerous other changes, substitutions, variations, alterations, and modifications.

The pixel array 110 may include a plurality of imaging pixels arranged in rows and columns. In one example, the plurality of imaging pixels can be arranged in a two-dimensional pixel array including rows and columns. In another example, the plurality of imaging pixels can be arranged in a three-dimensional pixel array. The plurality of imaging pixels may convert an optical signal into an electrical signal on a unit pixel basis or a pixel group basis, where the imaging pixels in a pixel group share at least certain internal circuitry. The pixel array 110 may receive pixel control signals, including a row selection signal, a pixel reset signal and a transfer signal, from the row driver 120. Upon receiving the pixel control signals, corresponding imaging pixels in the pixel array 110 may be activated to perform the operations corresponding to the row selection signal, the pixel reset signal, and the transfer signal. Each of the imaging pixels may generate photocharges corresponding to the intensity (or illuminance) of incident light, may generate an electrical signal corresponding to the amount of photocharges, thereby sensing the incident light. For convenience of description, the imaging pixel may also be referred to as a pixel.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row driver 120 may sequentially enable the pixel reset signal for resetting imaging pixels corresponding to at least one selected row, and the transfer signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node. The reference signal indicating unique reset noise of each pixel and the image signal indicating the intensity of incident light may be generically called a pixel signal as necessary.

The image sensing device 100 may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals into digital signals. In some implementations, the ADC 140 may be implemented as a ramp-compare type ADC. In some embodiments of the disclosed technology, the ADC 140 may convert the correlate double sampling signal generated by the CDS 130 for each of the columns into a digital signal, and output the digital signal.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 may be temporarily stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer upon receiving a control signal from the timing controller 170, and sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the ADC 140, the output buffer 150 and the column driver 160.

The timing controller 170 may provide the row driver 120, the column driver 160 and the output buffer 150 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

The CDS 130, the ADC 140, the output buffer 150, and the column driver 160, which generate and output image data by converting a pixel signal received from each pixel, may be collectively referred to as a readout circuit for convenience of description.

Referring to FIG. 3, three pixels are schematically illustrated, which include a target pixel PX, a first adjacent pixel PX_A1, and a second adjacent pixel PX_A2. In this example, the first adjacent pixel PX_A1 is adjacent to the target pixel PX and disposed on one side (e.g., the left side in the example of FIG. 3) of the target pixel PX, and the second adjacent pixel PX_A2 is adjacent to the target pixel PX and disposed on another side (e.g., the right side in the example of FIG. 3) of the target pixel PX. Thus, the first and second adjacent pixels PX_A1 and PX_A2 are disposed in the left and right directions with respect to the central target pixel PX.

Each of the pixels PX, PX_A1, and PX_A2 may include a microlens 510, an optical filter 520, and a substrate 530.

The microlens 510 may be formed over the optical filter 520, and may increase light gathering power of incident light, resulting in increased light reception (Rx) efficiency of the photoelectric conversion element included in the semiconductor substrate 530.

The optical filters 520 may selectively transmit light (e.g., red light, green light, blue light, magenta light, yellow light, cyan light, infrared (IR) light, or others) having a wavelength band to be transmitted. In this case, the wavelength band may refer to a wavelength band of light to be selectively transmitted by the corresponding optical filter. For example, each of the optical filters 520 may include a colored photosensitive material corresponding to a specific color, or may include thin film layers that are alternately arranged. The optical filters included in the pixel array 110 may be arranged to correspond to the pixels arranged in a matrix array including a plurality of rows and a plurality of columns, resulting in formation of an optical filter array.

In some implementations of the disclosed technology, it is assumed that light incident upon each of the pixels PX, PX_A1, and PX_A2 includes red light (R) corresponding to red color, green light (G) corresponding to green color, and blue light (B) corresponding to blue color.

The optical filter 520 that selectively transmits red light (R) may be defined as a red color filter, and a pixel that includes a red color filter and senses light corresponding to a red color may be defined as a red pixel. The optical filter 520 that selectively transmits green light (G) may be defined as a green color filter, and a pixel that includes a green color filter and senses light corresponding to a green color may be defined as a green pixel. The optical filter 520 that selectively transmits blue light (B) may be defined as a blue color filter, and a pixel that includes the blue color filter and senses light corresponding to a blue color may be defined as a blue pixel.

The optical filter 520 for transmitting all of red light (R), green light (G), and blue light (B) may be defined as a white color filter, and a pixel that includes a white color filter and senses light corresponding to all of the red, green, and blue colors may be defined as a white pixel. In addition, the optical filter 520 for selectively transmitting green light (G) and blue light (B) may be defined as a cyan color filter, and a pixel that includes a cyan color filter and senses light corresponding to green light (G) and blue light (B) may be defined as a cyan pixel.

The substrate 530 may be or include a semiconductor substrate. For example, the substrate 530 may be a P-type or N-type bulk substrate, may be or include a substrate formed by growing a P-type or N-type epitaxial layer on the P-type bulk substrate, or may be a substrate formed by growing a P-type or N-type epitaxial layer on the N-type bulk substrate. The substrate 530 may include a photoelectric conversion element corresponding to each of the pixels PX, PX_A1, and PX_A2. The photoelectric conversion element may generate and accumulate photocharges corresponding to the intensity of incident light that has passed through the microlens 510 and the optical filter 520. For example, the photoelectric conversion element may be implemented as a photodiode, a phototransistor, a photogate, a pinned photodiode or a combination thereof. Although not shown in FIG. 3, each of the pixels PX, PX_A1, and PX_A2 may include a plurality of transistors for converting photocharges accumulated in the photoelectric conversion element into electrical signals. For example, the plurality of transistors may include three, four, or five transistors. In the example, when each pixel (PX, PX_A1, PX_A2) includes four transistors, the transistors may include a reset transistor, a transfer transistor, a drive transistor, and a selection transistor. The pixel reset signal, the transfer signal, and the row selection signal described in FIG. 2 may be supplied to the reset transistor, the transfer transistor, and the select transistor, respectively.

In FIG. 3, it is assumed that the target pixel PX is a white pixel. Red light (R), green light (G), and blue light (B) may be incident upon the photoelectric conversion elements of the substrate 530 after penetrating the microlens 510 and the optical filter 520 of the target pixel (PX). A wavelength of red light (R) may be higher than a wavelength of green light (G), and a wavelength of green light (G) may be higher than a wavelength of blue light (B). For example, the wavelength of red light (R) may be about 0.6 μm, the wavelength of green light (G) may be about 0.53 μm, and the wavelength of blue light (B) may be about 0.45 μm. Here, the wavelength may mean an average value or a peak wavelength (i.e., a wavelength of light of the highest intensity) of a transmission wavelength band.

In general, when light having a specific wavelength passes through a slit having a specific width, the stronger diffraction occurs as the specific wavelength increases. Specifically, the diffraction is the greatest when a specific wavelength has a value equal to or approximate to a specific width.

The target pixel (PX) may correspond to one slit, and the width of the target pixel (PX) may correspond to a pixel size. The pixel size may refer to a width of the pixel array 110 in a row direction or a column direction. In some implementations of the disclosed technology, it is assumed that the width in a row direction of the pixel array 110 is the same as the width in a column direction of the pixel array 110.

In order to increase pixel resolution within a limited area, the size of a pixel may be gradually reduced. If a pixel size of the target pixel (PX) is 0.6 μm, green light (G) or blue light (B) has a smaller wavelength than the pixel size of the target pixel (PX) and red light (R) has a wavelength equal to or close to the pixel size of the target pixel (PX). When green light (G) or blue light (B) having a smaller wavelength than the pixel size of the target pixel (PX) is incident upon the target pixel (PX), diffraction may hardly occur. However, when red light (R) having a wavelength equal to or close to the pixel size of the target pixel (PX) is incident upon the target pixel (PX), strong diffraction may occur.

Due to diffraction of the red light R, a significant portion of the red light (R) incident upon the target pixel PX may be propagated to adjacent pixels (e.g., PX_A1 and PX_A2). Thus, a significant portion of the red light (R) incident upon the target pixel (PX) may not be captured by the photoelectric conversion element of the target pixel (PX), and may be propagated to adjacent pixels (e.g., PX_A1 and PX_A2), so that optical crosstalk captured by the adjacent pixels (e.g., PX_A1 and PX_A2) may occur significantly.

FIGS. 4A and 4B show graphs illustrating luminance ranges for each color that vary depending on pixel sizes based on some implementations of the disclosed technology. IN FIGS. 4A and 4B, the white pixel receiving the smallest amount of light (i.e., minimum light) is shown as MIN and the white pixel receiving the largest amount of light (i.e., maximum light) is shown as MAX. Referring to FIG. 4A, it is assumed that a white pixel (MIN) receiving the smallest amount of light (i.e., minimum light) and a white pixel MAX receiving the largest amount of light (i.e., maximum light) are alternately arranged in a line. Here, the minimum light may refer to light that causes a luminance value of each light (R, G, B) to have a signal to noise ratio (SNR) limit, and the maximum light may refer to light that causes a luminance value of each light (R, G, B) to have a saturation level. Also, the luminance value may refer to a value of image data converted by a corresponding pixel sensing each light (R, G, B).

The signal-to-noise ratio (SNR) threshold level refers to a threshold value of the luminance value that can satisfy a reference SNR that is predetermined. A luminance value less than the SNR threshold level may be treated as an invalid response not satisfying the reference SNR, and a luminance value equal to or greater than the SNR threshold level may be treated as a valid response satisfying the reference SNR. The reference SNR may be determined experimentally in consideration of characteristics of the image sensing device 100 and system requirements.

A saturation level refers to a maximum level that indicates the intensity of incident light. The saturation level may be determined by the capability (e.g., capacitance of a photoelectric conversion element) by which the pixel can convert the intensity of incident light into photocharges, the capability (e.g., capacitance of a floating diffusion (FD) region) by which photocharges can be converted into analog signals, and the capability (e.g., an input range of the ADC) by which analog signals can be converted into digital signals. As the intensity of incident light increases, the luminance value may increase in proportion to the intensity of incident light until the luminance value reaches the saturation level. After the luminance value reaches the saturation level, the luminance value may not increase although the intensity of incident light increases. For example, after the luminance value reaches the saturation level, the luminance value may have the same value as the saturation value and not increase above the saturation level.

Referring to FIG. 4A, a white pixel (MIN) receiving the smallest amount of red light (R) may have a minimum luminance value (Rmin), a white pixel (MAX) receiving the largest amount of red light (R) may have a maximum luminance value (Rmax), and an average value of the minimum luminance value (Rmin) and the maximum luminance value (Rmax) may correspond to an average luminance value (Ravg). Thus, each of the white pixels may have a luminance range (ΔR) corresponding to a difference between the maximum luminance value (Rmax) and the minimum luminance value (Rmin) for red light (R).

A white pixel (MIN) receiving the smallest amount of green light (G) may have a minimum luminance value (Groin), a white pixel (MAX) receiving the largest amount of green light (G) may have a maximum luminance value (Gmax), and an average value of the minimum luminance value (Groin) and the maximum luminance value (Gmax) may correspond to an average luminance value (Gavg). That is, each of the white pixels may have a luminance range (ΔG) corresponding to a difference between the maximum luminance value (Gmax) and the minimum luminance value (Groin) for green light (G).

A white pixel (MIN) receiving the smallest amount of blue light (B) may have a minimum luminance value (Broin), a white pixel (MAX) receiving the largest amount of blue light (B) may have a maximum luminance value (Bmax), and an average value of the minimum luminance value (Broin) and the maximum luminance value (Bmax) may correspond to an average luminance value (Bavg). That is, each of the white pixels may have a luminance range (ΔB) corresponding to a difference between the maximum luminance value (Bmax) and the minimum luminance value (Broin) for blue light (B).

In FIG. 4A, the reason why the average luminance value increases in the order of blue light (B), red light (R), and green light (G) is that photoelectric conversion efficiency in the photoelectric conversion element increases in the above order due to characteristics of light.

FIG. 4A is a graph for the case where the pixel size of each of the white pixels is larger than the wavelength of red light (R). In this case, in each white pixel, the diffraction of any light may hardly occur. The diffraction of the green light (G) and the diffraction of the blue light (B) may hardly occur. Referring to the example of FIG. 4A, the diffraction of the red light (R) may also hardly occur. Accordingly, the luminance range (ΔR) for red light (R) may have a range that is not significantly different from the luminance range (ΔG) for green light (G) and the luminance range (ΔB) for blue light (B).

Referring to FIG. 4B, in white pixels MIN and MAX that are alternately arranged in a line, a luminance range (ΔR) for red light (R) and a luminance range (ΔG) for green light (G), and a luminance range (ΔB) for blue light (B) are illustrated. Unlike FIG. 4A, FIG. 4B is a graph for a case where the pixel size of each of white pixels is the same as or close to the wavelength of red light (R). Unlike green light (G) and blue light (B), diffraction of red light (R) may occur strongly in each white pixel.

Due to diffraction of red light (R), a significant portion of the red light (R) incident upon each white pixel may propagate to adjacent pixels and be mixed with the adjacent pixels. As a result, a minimum luminance value (Rmin') for the red light (R) may be greater than a minimum luminance value (Rmin') shown in FIG. 4A, and a maximum luminance value (Rmax') for the red light (R) may be smaller than a maximum luminance value (Rmax') shown in FIG. 4A. Thus, each of the white pixels may have a significantly smaller luminance range (ΔR') for red light (R) shown in FIG. 4B, as compared to the luminance range (ΔR) for red light (R) shown in FIG. 4A. Since the total amount of light incident upon the white pixels is the same, the average luminance value (Ravg) of FIG. 4A may be equal to the average luminance value (Ravg) of FIG. 4B.

The SNR of each white pixel may be proportional to the sum of luminance ranges of red light (R), green light (G) and blue light (B). As the sum of average luminance values of red light (R), green light (G) and blue light (B) increases, the SNR of each white pixel may decrease.

When comparing the SNR of the white pixels in FIG. 4A with the SNR of the white pixels in FIG. 4B, the sum (Ravg+Gavg+Bavg) of the average luminance values is maintained, but the sum (ΔR'+ΔG+ΔB) of luminance ranges in FIG. 4B is reduced as compared to the sum (ΔR+ΔG+ΔB) of luminance ranges in FIG. 4A. Accordingly, when the pixel size of the white pixel becomes small enough to be similar to the wavelength of the red light (R), the SNR of image data generated by the white pixel becomes deteriorated, thereby degrading the quality of the image data.

Referring to FIG. 5A, distribution of light intensities according to wavelengths for each color of light is shown. The light intensity of each of white light (W), red light (R), green light (G), and blue light (B) may vary depending on wavelengths of the white light (W), the red light (R), the green light (G), and the blue light (B).

A wavelength having the highest intensity for each of the white light (W), the red light (R), the green light (G), and the blue light (B) may be defined as a peak wavelength. A peak wavelength may be sequentially increased in the order of blue light (B), green light (G), and red light (R), and wavelength bands in which blue light (B), green light (G), and red light (R) are distributed may overlap each other at least in part. In addition, the wavelength band in which white light (W) is distributed may include most of the wavelength bands in which blue light (B), green light (G), and red light (R) are distributed. Thus, it can be seen that the white light (W) includes all components of blue light (B), green light (G), and red light (R).

Referring to FIG. 5B, distribution of light intensities according to wavelengths for each color of light is shown. That is, the light intensity of each of cyan light (Cy), red light (R), green light (G), and blue light (B) may vary depending on wavelengths of the cyan light (Cy), the red light (R), the green light (G), and the blue light (B).

The peak wavelength may be sequentially increased in the order of blue light (B), green light (G), and red light (R), and wavelength bands in which blue light (B), green light (G), and red light (R) are distributed may overlap each other at least in part. In addition, the wavelength band in which cyan light (Cy) is distributed includes most of the wavelength bands in which blue light (B) and green light (G) are distributed, but may include only a portion of the wavelength band in which red light (R) is distributed. Thus, the cyan light (Cy) includes all components of blue light (B) and green light (G) but includes only some of the components of red light (R). For convenience of description, it is assumed that the cyan light (Cy) includes all components of blue light (B) and green light (G) without including components of red light (R).

As pixels are miniaturized in size, the amount of light incident upon each of the red, green, and blue pixels is reduced. Accordingly, the luminance value of each pixel is also lowered so that the SNR of each pixel is also lowered, thereby making it difficult to obtain an accurate image texture. Here, the image texture may mean a shape or outline of a subject in the image. In order to compensate for this problem, there may be considered a method of obtaining a more accurate image texture from image data of white pixels by arranging white pixels having a relatively large amount of light in a specific pattern on the pixel array 110.

However, as described above, when a pixel size of the white pixel satisfies a specific condition (i.e., the pixel size of the white pixel is equal to or close to the wavelength of red light R), a luminance range (ΔR') for red light (R) is reduced and the SNR of the white pixel is deteriorated, and thus it becomes difficult to obtain an accurate image texture.

Some implementations of the disclosed technology suggest a method for obtaining an image texture by arranging cyan pixels instead of white pixels on the pixel array 110. In this case, each of the cyan pixels may sense cyan light (Cy). Cyan light (Cy) may be obtained by removing, from white light (W), a component of red light (R) which causes SNR degradation. Generating the image data using the cyan pixels instead of the red pixels may help to have a relatively good SNR, thereby obtaining a more accurate image texture.

A difference between the pixel size (e.g., width) of each cyan pixel of the pixel array 110 and the wavelength of red light (R) may be smaller than either a difference between the pixel size (e.g., width) of each cyan pixel and the wavelength of green light (G) or a difference between the pixel size (e.g., width) of each cyan pixel and the wavelength of blue light (B).

Referring back to FIG. 1, the line memory 200 may include a volatile memory (e.g., DRAM, SRAM, etc.) and/or a non-volatile memory (e.g., a flash memory). The line memory 200 may have a capacity capable of storing image data corresponding to a predetermined number of lines. In this case, the line may refer to a row of the pixel array 110, and the predetermined number of lines may be less than a total number of rows of the pixel array 110. Therefore, the line memory 200 may be a line memory capable of storing image data corresponding to some rows (or some lines) of the pixel array 110, rather than a frame memory capable of storing image data corresponding to a frame captured by the pixel array 110. In some implementations, the line memory 200 may also be replaced with a frame memory as needed.

The line memory 200 may receive image data from the image sensing device 100, may store the received image data, and may transmit the stored image data to the ISP 300 based on the control of the ISP 300.

The ISP 300 may perform image processing of the image data stored in the line memory 200. The ISP 300 may reduce noise of image data, and may perform various kinds of image signal processing (e.g., gamma correction, color filter array interpolation, color matrix, color correction, color enhancement, lens distortion correction, etc.) for image-quality improvement of the image data. In addition, the ISP 300 may compress image data that has been created by execution of image signal processing for image-quality improvement, such that the ISP 300 can create an image file using the compressed image data. Alternatively, the ISP 300 may recover image data from the image file. In this case, the scheme for compressing such image data may be a reversible format or an irreversible format. As a representative example of such compression format, in the case of using a still image, Joint Photographic Experts Group (JPEG) format, JPEG 2000 format, or the like can be used. In addition, in the case of using moving images, a plurality of frames can be compressed according to Moving Picture Experts Group (MPEG) standards such that moving image files can be created. For example, the image files may be created according to Exchangeable image file format (Exif) standards.

The ISP 300 may include a first interpolation unit 310 and a second interpolation unit 320. The first interpolation unit 310 and the second interpolation unit 320 may be collectively referred to as a demosaicing block. The demosaicing block may convert image data (i.e., raw image data) corresponding to one color for each pixel into image data (i.e., RGB image data) corresponding to three colors (red, green, blue) for each pixel.

The first interpolation unit 310 may divide the raw image data into four raw images (i.e., raw cyan image, raw red image, raw green image, and raw blue image) of the respective colors (cyan, red, green, and blue), and may generate a cyan interpolation image by performing first interpolation on the raw cyan image. In some implementations, the first interpolation may refer to linear interpolation, without being limited thereto.

The second interpolation unit 320 may generate a red interpolation image by performing second interpolation on the raw red image using the cyan interpolation image. In addition, the second interpolation unit 320 may generate a green interpolation image by performing second interpolation on the raw green image using the cyan interpolation image. The second interpolation unit 320 may generate a red interpolation image by performing second interpolation on the raw red image using a cyan interpolation image. Also, the second interpolation unit 320 may generate a green interpolation image by performing second interpolation on the raw green image using the cyan interpolation image. In addition, the second interpolation unit 320 may generate a blue interpolation image by performing second interpolation on the raw blue image using the cyan interpolation image. In some implementations, the second interpolation may refer to linear regression, without being limited thereto.

The first interpolation unit 310 and the second interpolation unit 320 will be described later with reference to FIGS. 7 and 8.

The ISP 300 may transmit the completely interpolated RGB data to the input/output (I/O) interface 400. In some implementations, the ISP 300 may perform additional image signal processing (e.g., edge enhancement processing) on RGB data and transmit the resultant RGB data to the I/O interface 400.

The I/O interface 400 may perform communication with the host device 20, and may transmit the ISP image data to the host device 20. In some implementations, the I/O interface 400 may be implemented as a mobile industry processor interface (MIPI), but is not limited thereto.

The host device 20 may be a processor (e.g., an application processor) for processing the ISP image data received from the imaging device 10, a memory (e.g., a non-volatile memory) for storing the ISP image data, or a display device (e.g., a liquid crystal display (LCD)) for visually displaying the ISP image data.

Figure 6A:
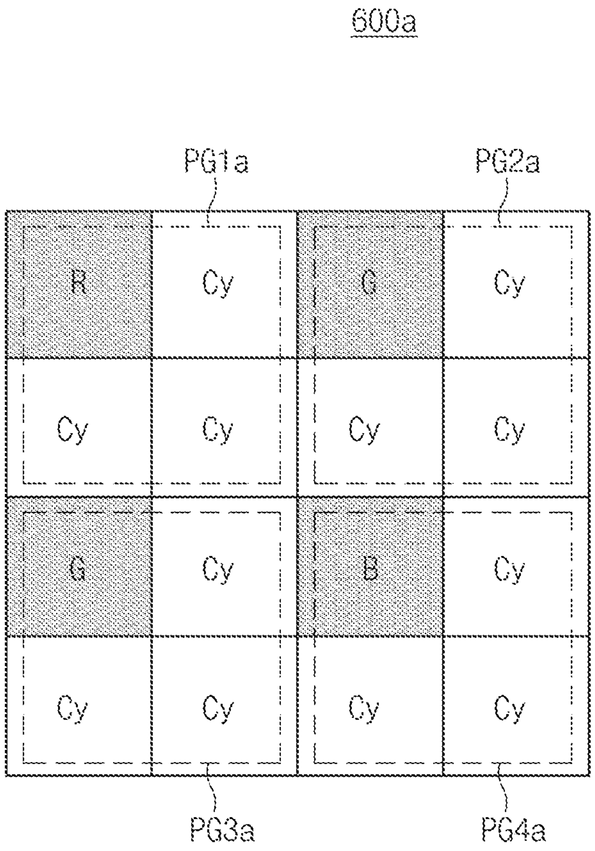
FIG. 6A is a diagram illustrating an example of a portion of a pixel array based on some implementations of the disclosed technology.

FIG. 6A is a diagram illustrating an example of a portion of the pixel array based on some implementations of the disclosed technology.

Referring to FIG. 6A, 16 pixels are arranged in a matrix including four rows and four columns. For example, 16 pixels may be used as a minimum unit of the pixel array 110, and the 16 pixels may be repeated in row and column directions without being limited thereto.

The array shape of 6 pixels may be defined as a first pattern 600*a*. The first pattern 600*a* may include first to fourth pixel groups PG1*a* to PG4*a*. The first to fourth pixel groups PG1*a* to PG4*a* may be arranged in a (2×2) matrix. The first pixel group PG1*a* and the fourth pixel group PG4*a* may be arranged diagonal to each other, and the second pixel group PG2*a* and the third pixel group PG3*a* may be arranged diagonal to each other. Each of the first to fourth pixel groups PG1*a* to PG4*a* may include four pixels arranged in a (2×2) matrix.

The first pixel group PG1*a* may include one red pixel and three cyan pixels, and the fourth pixel group PG4*a* may include one blue pixel and three cyan pixels. In addition, each of the second and third pixel groups PG2*a* and PG3*a* may include one green pixel and three cyan pixels.

In each of the pixel groups PG1*a* to PG4*a*, a position where the red pixel is disposed, a position where the blue pixel is disposed, and a position where the green pixel is disposed may be the same as each other so as to reduce the amount of computation required for image signal processing by the ISP 300, without being limited thereto.

Each of the first to fourth pixel groups PG1*a* to PG4*a* may include a red pixel, a blue pixel, or a green pixel constituting a Bayer pattern, and may further include cyan pixels, resulting in formation of a more accurate image texture.

Figure 6B:
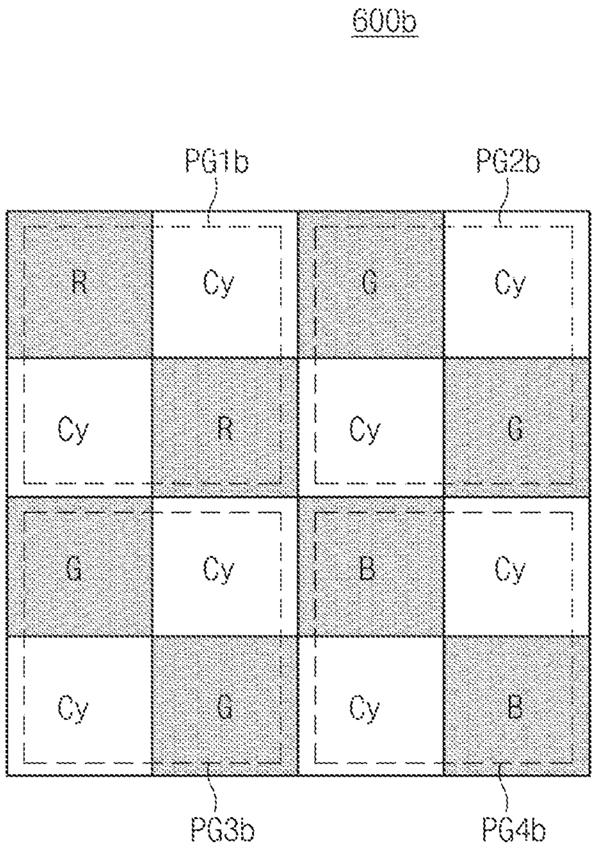
FIG. 6B is a diagram illustrating another example of a portion of the pixel array based on some implementations of the disclosed technology.

FIG. 6B is a diagram illustrating another example of a portion of the pixel array based on some implementations of the disclosed technology.

Referring to FIG. 6B, a second pattern 600*b*, which is an array of 16 pixels constituting a matrix including 4 rows and 4 columns is shown, is illustrated. The second pattern 600*b* may include first to fourth pixel groups PG1*b* to PG4*b*. Since the second pattern 600*b* is substantially the same as the first pattern 600*a* of FIG. 6A except for some differences, the structure and operation of the second pattern 600*b* will hereinafter be described centering upon such differences for convenience of description.

The first pixel group PG1*b* may include two red pixels and two cyan pixels, and the fourth pixel group PG4*b* may include two blue pixels and two cyan pixels. In addition, each of the second and third pixel groups PG2*b* and PG3*b* may include two green pixels and two cyan pixels.

In each of the pixel groups PG1*b* to PG4*b*, the same type of pixels may be arranged in a diagonal direction, and the positions where cyan pixels are arranged may be equal to each other, without being limited thereto.

Each of the first to fourth pixel groups PG1*b* to PG4*b* includes a red pixel, a blue pixel, or a green pixel constituting a Bayer pattern, and further includes cyan pixels so that a more accurate image texture can be obtained. Compared to the example of FIG. 6A, each of the first to fourth pixel groups PG1*b* to PG4*b* increases the ratio of pixels constituting the Bayer pattern in each pixel group so that more accurate color information can be reflected in RGB image data.

Figure 6C:
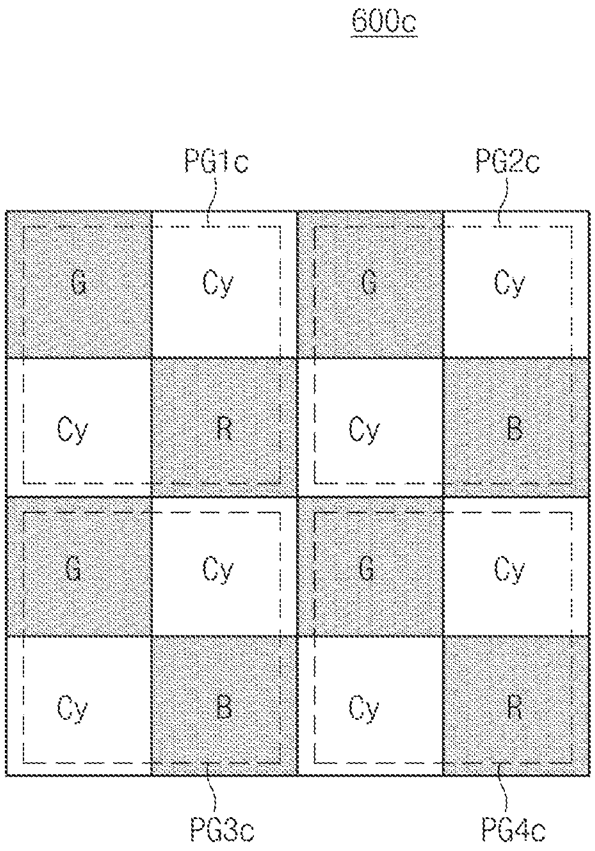
FIG. 6C is a diagram illustrating still another example of a portion of the pixel array based on some implementations of the disclosed technology.

FIG. 6C is a diagram illustrating still another example of a portion of the pixel array based on some implementations of the disclosed technology.

Referring to FIG. 6C, a third pattern 600*c*, which is an array of 16 pixels constituting a matrix including 4 rows and 4 columns is shown, is illustrated. The third pattern 600*c* may include first to fourth pixel groups PG1*c* to PG4*c*. Since the third pattern 600*c* is substantially the same as the second pattern 600*b* of FIG. 6B except for some differences, the structure and operation of the third pattern 600*c* will hereinafter be described centering upon such differences for convenience of description.

Each of the first pixel group PG1*c* and the fourth pixel group PG4*c* may include one green pixel, one red pixel, and two cyan pixels. In addition, each of the second pixel group PG2*c* and the third pixel group PG3*c* may include one green pixel, one blue pixel, and two cyan pixels.

In each of the pixel groups PG1*c* to PG4*c*, cyan pixels may be arranged in a diagonal direction, and a green pixel and any one of a red pixel and a blue pixel may also be arranged in a diagonal direction, without being limited thereto.

Each of the first to fourth pixel groups PG1*c* to PG4*c* may include a green pixel and any one of a red pixel and a blue pixel constituting a Bayer pattern, may further include cyan pixels so that a more accurate image texture can be obtained. Compared to the other example of FIG. 6B, each of the first to fourth pixel groups PG1*c* to PG4*c* may be arranged so that each pixel group includes a green pixel having excellent photoelectric conversion efficiency, so that a more accurate image texture can be obtained.

FIGS. 6A to 6C illustrate the embodiments in which pixels are arranged in units of a plurality of pixel groups, each of which includes at least one of the red pixel, the green pixel, and the blue pixel and at least one cyan pixel, without being limited thereto.

The technical idea of the disclosed technology may include various embodiments in which the pixel array 110 includes color pixels (e.g., red, green, and blue pixels) for detecting color information and cyan pixels for detecting an image texture.

In addition, such arrangement of the cyan pixels for detecting an image texture is merely an example, and the technical idea of the disclosed technology may include various embodiments in which pixels, that are capable of filtering and blocking light having a wavelength within a predetermined error range (for example, ±0.05 μm) from the pixel size (e.g., width) of each pixel of the pixel array 110, are arranged as pixels for detecting an image texture so that diffraction of incident light can be minimized to detect the image texture.

For example, when the pixel size of each pixel of the pixel array 110 is about 0.45 μm, the image sensing device 100 may include a yellow pixel (e.g., a pixel configured to transmit only red light R and green light G) as a pixel for detecting the image texture. In this case, the yellow pixel can filter and block blue light (B) having a wavelength within a predetermined error range (for example, ±0.05 μm) from the pixel size (e.g., 0.45 μm) of each pixel.

Figure 7:
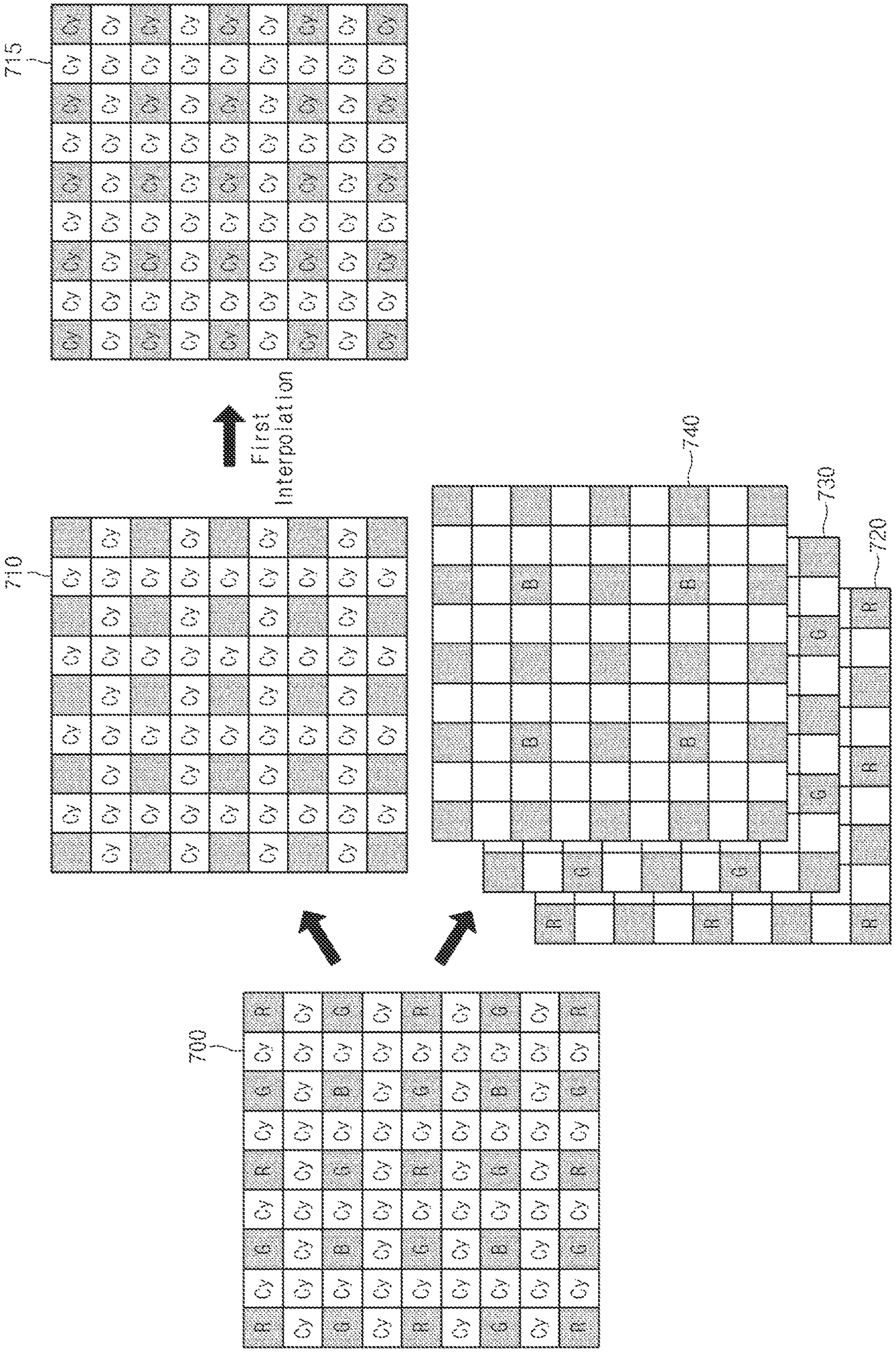
FIG. 7 is a diagram illustrating an example of operations of a first interpolation unit shown in FIG. 1 based on some implementations of the disclosed technology.

FIG. 7 is a diagram illustrating an example of operations of the first interpolation unit 310 shown in FIG. 1 based on some implementations of the disclosed technology.

Referring to FIG. 7, the first interpolation unit 310 may perform first interpolation for the raw image data 700 received from the pixel array 110 having the first pattern 600*a* of FIG. 6A. As to be discussed with reference to FIG. 8, the second interpolation unit 320 may perform second interpolation for the cyan interpolation image 715 and the raw red image 720, which are obtained as a result of the first interpolation. For convenience of description, the embodiment of FIG. 7 will hereinafter be described with reference to the first pattern 600*a* of FIG. 6A, without being limited thereto. For example, the first interpolation and the second interpolation can be applied not only to the pixel array 110 having the first pattern 600 of FIG. 6A but also to the pixel array 110 having the second pattern 600*b* of FIG. 6B, the third pattern 600*c* of FIG. 6C, or other various patterns. When the first interpolation and the second interpolation are applied to the second pattern 600*b* of FIG. 6B, the third pattern 600*c* of FIG. 6C, or other various patterns, the operations of the first and second interpolations may be identical or substantially similar to those applied to the first pattern 600*a* of FIG. 6A.

The first interpolation unit 310 may divide the raw image data 700 received from the pixel array 110 having the first pattern 600*a* into a raw cyan image 710 for cyan color, a raw red image 720 for red color, a raw green image 730 for green color, and a raw blue image 740 for blue color. Although FIGS. 7 and 8 exemplarily illustrate that the raw image data 700 serving as a unit of the first interpolation and the second interpolation is configured to have a (9×9) matrix array, other implementations are also possible, and the raw image data may have a different size (e.g., (5×5) matrix).

The raw image data 700 may correspond to a set of image data of cyan pixels, image data of red pixels, image data of green pixels, and image data of blue pixels. Image data of the cyan pixels may be defined as cyan pixel data, image data for red pixels may be defined as red pixel data, image data for green pixels may be defined as green pixel data, and image data for blue pixels may be defined as blue pixel data.

The first interpolation unit 310 may generate a cyan interpolation image 715 by performing first interpolation on the raw cyan image 710. In some implementations, the first interpolation may be linear interpolation, without being limited thereto.

For example, the first interpolation unit 310 may calculate an arithmetic mean of cyan pixel data of cyan pixels included within a certain range around a pixel (i.e., a first interpolation target pixel) in which cyan pixel data does not exist in the raw cyan image 710, and may determine the calculated arithmetic mean to be cyan pixel data of the first interpolation target pixel. Alternatively, the first interpolation unit 310 may calculate a value obtained by calculating a weighted average using the distance to the first interpolation target pixel as a weight, and may determine the calculated value to be cyan pixel data of the first interpolation target pixel.

The first interpolation unit 310 may generate a cyan interpolation image 715 by performing first interpolation on all first interpolation target pixels included in the raw cyan image 710.

In some implementations, the first interpolation unit 310 may perform first interpolation on the raw red image 720 to generate a red intermediate image (not shown), and may transmit the red intermediate image to the second interpolation unit 320. Similarly, the first interpolation unit 310 may perform first interpolation on the raw green image 730 to generate a green intermediate image (not shown), and may transmit the green intermediate image to the second interpolation unit 320. The first interpolation unit 310 may perform first interpolation on the raw blue image 740 to generate a blue intermediate image (not shown), and may transmit the blue intermediate image (not shown) to the second interpolation unit 320.

Figure 8:
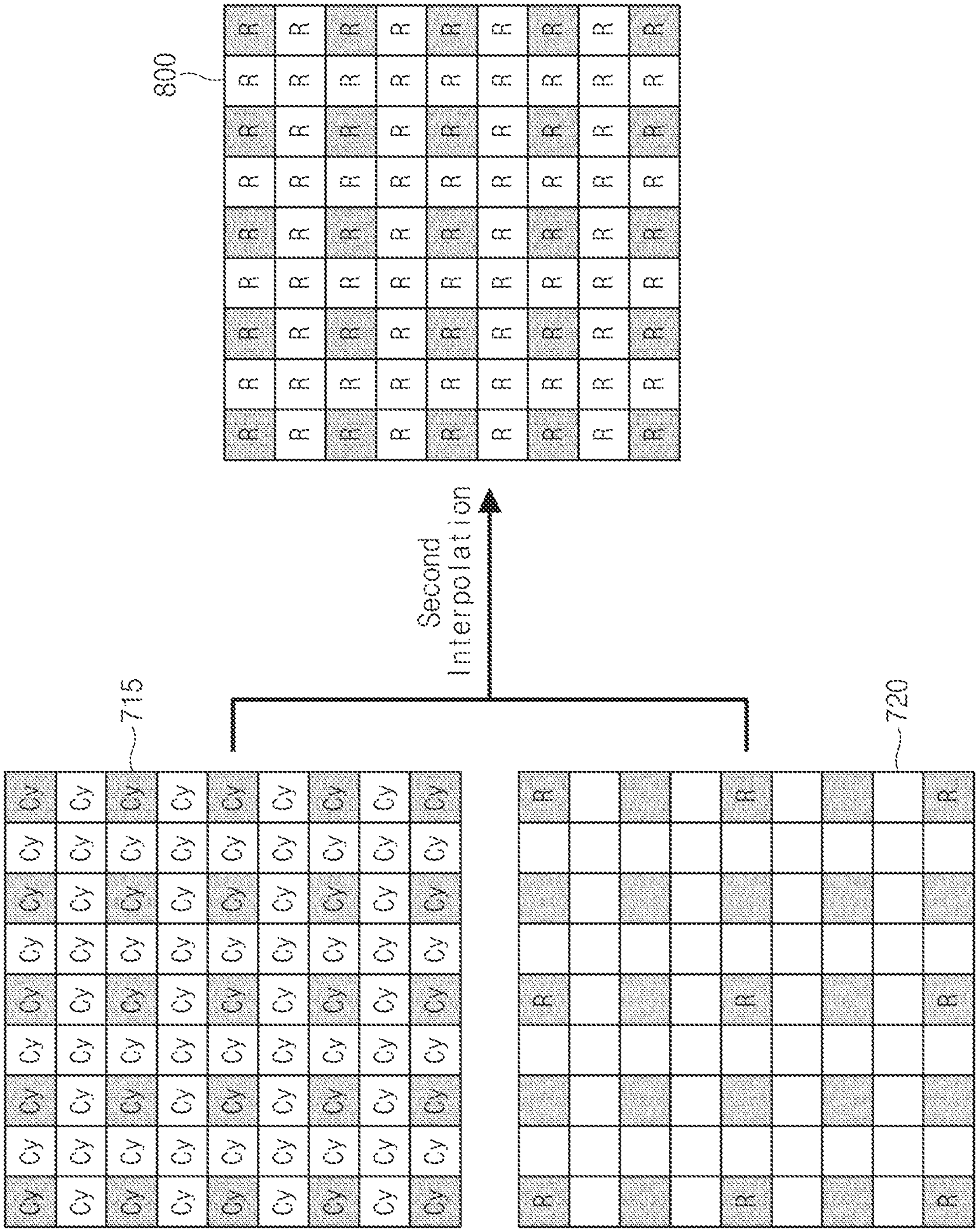
FIG. 8 is a diagram illustrating an example of operations of a second interpolation unit shown in FIG. 1 based on some implementations of the disclosed technology.

FIG. 8 is a diagram illustrating an example of operations of the second interpolation unit 320 shown in FIG. 1 based on some implementations of the disclosed technology.

Referring to FIG. 8, the second interpolation unit 320 may generate a red interpolation image 800 by performing second interpolation on the cyan interpolation image 715 and the raw red image 720. In some implementations, the second interpolation may be linear regression, without being limited thereto.

For example, the second interpolation unit 320 may calculate red pixel data of a pixel (i.e., a second interpolation target pixel) in which red pixel data does not exist in the raw red image 720, using a linear regression function denoted by the following equation 1.

$$Ri = a \times Cyi + b \quad \text{[Equation 1]}$$

In Equation 1, 'a' denotes a regression coefficient, and 'b' denotes a regression intercept. In addition, 'Cyi' denotes cyan pixel data of the cyan interpolation image 715, and 'Ri' denotes red pixel data of the red interpolation image 800 obtained by second interpolation.

The regression coefficient (a) may be a value determined experimentally for the raw red image 720. The regression coefficient (a) may be corrected to reduce a difference between red pixel data (Ri) and a red intermediate image corresponding to the red pixel data (Ri).

The regression intercept (b) may be a value associated with data of the red intermediate image corresponding to the red pixel data (Ri). Here, the associated value may mean the same value or a value obtained by applying necessary processing (e.g., scale adjustment).

Cyi serving as cyan pixel data of the cyan interpolation image 715 may be one piece of cyan pixel data corresponding to the red pixel data (Ri). In some other implementations, Cyi may be a value obtained by mixing at least one piece of cyan pixel data included in a predetermined range (e.g., (3×3) matrix) from the cyan pixel data. Through such mixing, noise generated at the boundary of the subject can be reduced.

Since the second interpolation unit 320 generates a red interpolation image 800 through second interpolation using the cyan interpolation image 715 for the raw red image 720, the second interpolation unit 320 may reflect a more accurate image texture onto the raw red image 720 that was severely blurred due to diffraction of the red light (R), resulting in formation of a red interpolation image 800 having better contrast. In this case, severe blurring may indicate that incident light rays of the adjacent pixels are mixed due to diffraction so that a luminance range is reduced and unexpected image blurring occurs.

In addition, the second interpolation unit 320 may generate each of a green interpolation image and a blue interpolation image using substantially the same method as the above-described second interpolation.

The second interpolation unit 320 may output the red interpolation image, the green interpolation image, and the blue interpolation image as RGB image data to the outside.

In some implementations, the regression coefficient (a) used in the second interpolation for generating the red interpolation image 800 may be different from the regression coefficient (a) used in the second interpolation for generating the green interpolation image or the blue interpolation image. For example, the regression coefficient (a) (i.e., the regression coefficient for the raw red image 720) used in the second interpolation for generating the red interpolation image 800 may be greater than the regression coefficient (a) (i.e., the regression coefficient for the raw green image 730 or the raw blue image 740) used in the second interpolation for generating the green interpolation image or the blue interpolation image. Since the blur phenomenon of the raw red image 720 is relatively severe, a specific gravity of the cyan pixel data (Cyi) of the cyan interpolation image 715 during the second interpolation may increase to make the image texture clearer.

In some implementations, the ISP 300 may perform edge enhancement processing on the raw red image 720 before the operation of the second interpolation unit 320. This serves to make the image texture of the red interpolation image 800 clearer by increasing the contrast of the raw red image 720 before demosaicing.

In some implementations, instead of using a raw green image or a raw blue image used in the second interpolation for generating a green interpolation image or a blue interpolation image, the ISP 300 may use the raw green image corrected using the cyan interpolation image or may use the blue interpolation image. For example, since the cyan interpolation image includes both green light (G) information and blue light (B) information, the result of subtracting the raw green image from the cyan interpolation image for each pixel may be an image including blue light (B) information. Since these images can provide blue pixel data even for pixels in which blue pixel data does not exist in the raw blue image 740, the raw blue image can be corrected (e.g., merged) using such images, so that RGB data having more accurate color information can be obtained.

As is apparent from the above description, the image sensing device based on some implementations of the disclosed technology can obtain an image having improved contrast (higher-contrast image) by arranging a portion of cyan pixels in a pixel array.

The embodiments of the disclosed technology may provide a variety of effects capable of being directly or indirectly recognized through the above-mentioned patent document.

Although a number of illustrative embodiments have been described, it should be understood that modifications and enhancements to the disclosed embodiments and other embodiments can be devised based on what is described and/or illustrated in this patent document.

What is claimed is:

1. An image sensing device comprising:

first to fourth pixel groups arranged in a (2×2) matrix including two rows and two columns, wherein each of the first to fourth pixel groups includes 1) at least one of a red pixel including a red color filter configured to transmit light corresponding to a red color, a green pixel including a green color filter configured to transmit light corresponding to a green color, or a blue pixel including a blue color filter configured to transmit light corresponding to a blue color, and 2) at least one cyan pixel including a cyan color filter configured to transmit light corresponding to the green color and the blue color, wherein a difference between a wavelength of red light and a width of each cyan pixel is smaller than a difference between a wavelength of green or blue light and the width of each cyan pixel.

2. The image sensing device according to claim 1, wherein:

the first pixel group and the fourth pixel group are arranged in a direction diagonal to each other; and the second pixel group and the third pixel group are disposed in a direction diagonal to each other.

3. The image sensing device according to claim 2, wherein:

the first pixel group includes one red pixel and three cyan pixels;

the fourth pixel group includes one blue pixel and three cyan pixels; and each of the second pixel group and the third pixel group includes one green pixel and three cyan pixels.

4. The image sensing device according to claim 3, wherein:

each of the red pixel, the green pixel, and the blue pixel is disposed in a same position with respect to the three cyan pixels in a corresponding pixel group.

5. The image sensing device according to claim 2, wherein:

the first pixel group includes two red pixels and two cyan pixels;

the fourth pixel group includes two blue pixels and two cyan pixels; and each of the second pixel group and the third pixel group includes two green pixels and two cyan pixels.

6. The image sensing device according to claim 5, wherein:

in each of the first to fourth pixel groups, the two red pixels, the two green pixels, or the two blue pixels are arranged to be adjacent in a diagonal direction.

7. The image sensing device according to claim 2, wherein:

each of the first pixel group and the fourth pixel group includes one green pixel, one red pixel, and two cyan pixels; and each of the second pixel group and the third pixel group includes one green pixel, one blue pixel, and two cyan pixels.

8. The image sensing device according to claim 7, wherein:

the two cyan pixels of each of the first to fourth pixel groups are disposed in a same position with respect to the green pixel in a corresponding pixel group.

9. An imaging device comprising:

an image sensing device configured to have a pixel array that includes red pixels configured to generate first image data in response to receiving light corresponding to a red color, green pixels configured to generate second image data in response to receiving light corresponding to a green color, blue pixels configured to generate third image data in response to receiving light corresponding to a blue color, and cyan pixels configured to generate fourth image data in response to receiving light corresponding to the blue color and the green color; and an image signal processor (ISP) configured to generate RGB image data by interpolating raw image data including the first image data, the second image data, the third image data, and the fourth image data, wherein the pixel array includes a plurality of pixel groups, each of which includes 1) at least one of the red pixels, at least one of the green pixels, or at least one of the blue pixels, and 2) at least one cyan pixel, wherein the image signal processor (ISP) includes:

a first interpolation unit configured to divide the raw image data into a raw red image generated from the red pixels, a raw green image generated from the green pixels, a raw blue image generated from the blue pixels, and a raw cyan image generated from the cyan pixels, and generate a cyan interpolation image by performing a first interpolation on the raw cyan image; and a second interpolation unit configured to perform a second interpolation on each of the raw red image, the raw green image, and the raw blue image using the cyan interpolation image to generate a red interpolation image, a green interpolation image, and a blue interpolation image.

10. The imaging device according to claim 9, wherein:

the first interpolation is a linear interpolation.

11. The imaging device according to claim 9, wherein:

the second interpolation is a linear regression; and the second interpolation unit, for an interpolation target pixel in which corresponding pixel data does not exist in each of the raw red image, the raw green image, and the raw blue image, calculates the cyan interpolation image using a linear regression function including a regression coefficient to generate pixel data of the interpolation target pixel.

12. The imaging device according to claim 11, wherein:

a regression coefficient for the raw red image is greater than a regression coefficient for the raw green image or the raw blue image.

13. The imaging device according to claim 11, wherein:

the image signal processor (ISP) performs edge enhancement processing on the raw red image before performing the second interpolation on the raw red image.

14. The imaging device according to claim 9, wherein:

a difference between a wavelength of red light and a width of the cyan pixel is smaller than a difference between a wavelength of green or blue light and the width of the cyan pixel.

15. An imaging device comprising:

an image sensing device configured to have a pixel array that includes red pixels configured to generate first image data in response to receiving light corresponding to a red color, green pixels configured to generate second image data in response to receiving light corresponding to a green color, blue pixels configured to generate third image data in response to receiving light corresponding to a blue color, and cyan pixels configured to generate fourth image data in response to receiving light corresponding to the blue color and the green color; and an image signal processor (ISP) configured to generate RGB image data by interpolating raw image data including the first image data, the second image data, the third image data, and the fourth image data, wherein the pixel array includes a plurality of pixel groups, each of which includes 1) at least one of the red pixels, at least one of the green pixels, or at least one of the blue pixels, and 2) at least one cyan pixel, wherein the plurality of pixel groups includes four pixel groups, each of four pixel groups including two or three cyan pixels.

16. The imaging device according to claim 15, wherein two cyan pixels of the two or three cyan pixels in each of the four pixel groups are disposed to be adjacent to each other in a diagonal direction.

* * * * *